{12} United States Patent
Felton

(10) Patent No.: US 7,308,670 B2
(45) Date of Patent: Dec. 11, 2007

(54) SYSTEM AND METHOD FOR DESIGNING ELECTRICAL TRACE LENGTHS ON PRINTED CIRCUIT BOARDS BETWEEN IMPEDANCE DISCONTINUITIES

(75) Inventor: Mickey Steven Felton, Sterling, MA (US)

(73) Assignee: EMC Corporation, Hopkinton, MA (US)

( * ) Notice: Subject to any disclaimer, the term of this patent is extended or adjusted under 35 U.S.C. 154(b) by 452 days.

(21) Appl. No.: 11/015,219

(22) Filed: Dec. 17, 2004

(65) Prior Publication Data

US 2006/0136857 A1    Jun. 22, 2006

(51) Int. Cl.
    G06F 17/50    (2006.01)
(52) U.S. Cl. .......................................... 716/15; 716/14
(58) Field of Classification Search ............. 716/13–16
    See application file for complete search history.

(56) References Cited

U.S. PATENT DOCUMENTS 6,687,842 B1 * 2/2004 DiStefano et al. .......... 713/500
7,032,189 B2 * 4/2006 Upton et al. ................... 716/1
7,042,067 B2 * 5/2006 Giaretta et al. ............. 257/664
7,170,166 B2 * 1/2007 Rofougaran ................ 257/728

* cited by examiner

Primary Examiner—Jack Chiang
Assistant Examiner—Binh Tat
(74) Attorney, Agent, or Firm—Guerin & Rodriguez, LLP; Michael A. Rodriguez

(57) ABSTRACT

Described is a system and method of designing a length of an electrical trace used to implement a point-to-point serial link for conveying a digital signal between a transmitter and a receiver. A trace segment of the electrical trace is identified. The trace segment has a first endpoint determined by a first impedance discontinuity on the point-to-point serial link and a second endpoint determined by a second impedance discontinuity on the point-to-point serial link. A restricted length is calculated for the trace segment based on a propagation delay of the signal along the trace segment and a frequency of the signal. A length of the trace segment is set to be unequal to the restricted length.

20 Claims, 5 Drawing Sheets

SYSTEM AND METHOD FOR DESIGNING ELECTRICAL TRACE LENGTHS ON PRINTED CIRCUIT BOARDS BETWEEN IMPEDANCE DISCONTINUITIES

FIELD OF THE INVENTION

The invention relates generally to digital signal transmission on printed circuit boards. More particularly, the invention relates to a system and method for designing the lengths of electrical traces on printed circuit boards.

BACKGROUND

In the development of electrical systems, designers must carefully consider a variety of factors that can negatively affect the performance of signal transmission over high-speed serial links on printed circuit boards. Among such factors are signal crosstalk, stubs, physical dimensions, material properties, and impedance. Particularly problematic are signal reflections, which can occur at various locations along a high-speed serial link. Reflected signals travel back on the serial link toward the transmitter of the signal, interfering with other signals traversing the serial link, and potentially reducing signal integrity of signals subsequently transmitted by the transmitter. Defects in the signals typically manifest as jitter and altered amplitude.

Although determining the cause and effect of signal reflections is often complicated, signal reflections often occur at an interface between dissimilar media (e.g., a connector pin contacting an electrical trace). The nature of the interface generally determines the nature of the signal reflection at the interface. For example, the amplitude and phase of a reflected signal depends upon any mismatch of impedances of the dissimilar media at the interface. Herein, such interfaces are generally referred to as impedance discontinuities. One solution to the problem of signal reflection is to minimize or eliminate impedance mismatches at an interface. However, it may be impractical to eliminate all potential causes of signal reflection along a high-speed serial link. Thus, there remains a need of another technique for reducing or eliminating the effects of signal reflection on serial links on printed circuit boards.

SUMMARY

In one aspect, the invention features a method of designing a length of an electrical trace used to implement a point-to-point serial link for conveying a digital signal between a transmitter and a receiver. A trace segment of the electrical trace is identified. The trace segment has a first endpoint determined by a first impedance discontinuity on the point-to-point serial link and a second endpoint determined by a second impedance discontinuity on the point-to-point serial link. A restricted length is calculated for the trace segment based on a propagation delay of the signal along the trace segment and on a frequency of the signal. A length of the trace segment is set to be unequal to the restricted length.

In another aspect, the invention features a system, comprising a transmitter transmitting a digital signal at a frequency and a receiver in communication with the transmitter by way of a point-to-point serial link for receiving the digital signal. A trace segment in the point-to-point serial link has a first endpoint determined by a first impedance discontinuity on the point-to-point serial link and a second endpoint determined by a second impedance discontinuity on the point-to-point serial link. The trace segment has a trace length that is unequal to a restricted length determined for the point-to-point serial link based on a propagation delay of the digital signal and the frequency.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

High-speed signals (e.g., 1 GHz and greater) traveling over a point-to-point serial link are subject to signal reflections caused by impedance discontinuities. An impedance discontinuity is any feature of the point-to-point serial link that causes a change in its impedance (e.g., a via, or an interface between a trace etch and a connector). As used herein, a point-to-point serial link means a one-to-one or end-to-end communication path between a single source and a single destination; that is, the signal propagating over the serial link originates at a transmitter and terminates at a receiver. Signal reflections can negatively affect the signal integrity on the serial link and result in signaling errors. Electrical traces (or etches) constructed in accordance with the invention have lengths that are designed to eliminate or diminish the effect of such signal reflections on the signals.

Figure 1:
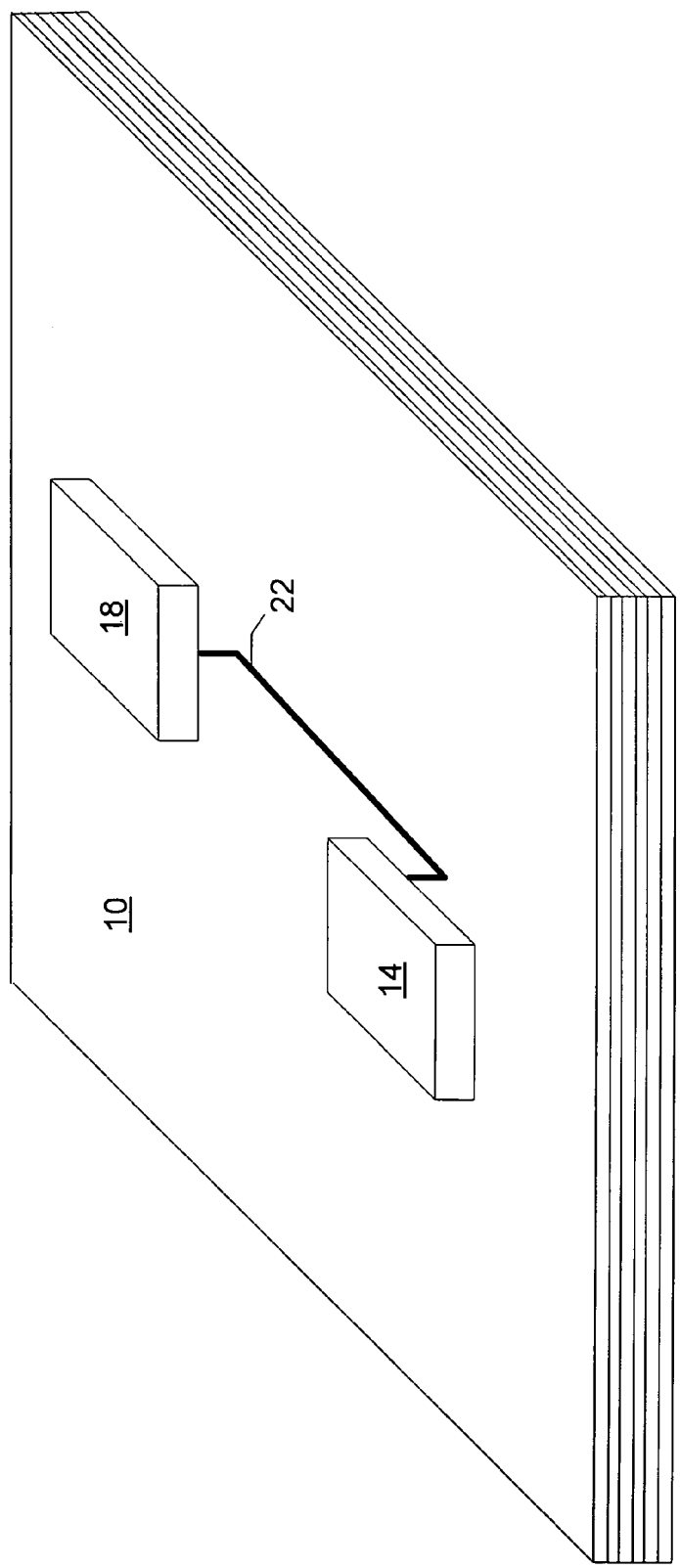
FIG. 1 is an oversimplified diagram of a multi-layer printed circuit board having a transmitter in communication with a receiver by way of an electrical trace embodying a serial link.

FIG. 1 shows an oversimplified embodiment of a printed circuit board 10 having a first electrical component 14 in electrical communication with a second electrical component 18 by way of an electrical trace 22. In one embodiment, the printed circuit board 10 is a copper-clad, multilayer board made of FR4 material. Here, the electrical trace 22 extends between the electrical components 14, 18 and passes into and along one of the inner layers of the printed circuit board 10. The electrical trace 22 serves as a medium (e.g., a copper etch) for a point-to-point serial link between the electrical components 14, 18. The length of the electrical trace 22 is designed to reduce or eliminate the effect of signal reflection on the signals passing between the electrical components 14, 18, as described in more detail below.

For the purposes of illustrating the invention, the first electrical component 14 is a transmitter and the second electrical component 18 is a receiver of a periodic digital signal (e.g., a clock signal) sent over the serial link. Although shown as being on the same printed circuit board, the electrical components 14, 18 can be disposed on different printed circuit boards, with the serial link spanning the distance between the components 14, 18. In addition, it is to be understood that the roles of transmitter and receiver can be reversed without departing from the principles of the invention, namely, the second electrical component 18 can also transmit a digital signal to the first electrical component 14 (in effect, both electrical components 14, 18 operating as transceivers).

Various types of electrical systems, e.g., computer systems, storage systems, can have one or more printed circuit boards 10 with serial links designed in accordance with the invention. In a storage system, for example, the transmitter 14 can be a link control card (LCC) and the receiver 18 can be a disk drive (here, the electrical components 14, 18 being disposed on different printed circuit boards). The LCC communicates with the disk drive by sending encoded signals (e.g., 8B/10B) over a point-to-point high-speed serial link (embodied by the electrical trace 22). These communications occur in accordance with a communication protocol, e.g., Fibre Channel. Fibre Channel, for example, serves as a standard for networking, storage and data transfer and defines a high-speed data transfer interface for connecting workstations, mainframes, supercomputers, and storage devices.

Figure 2:
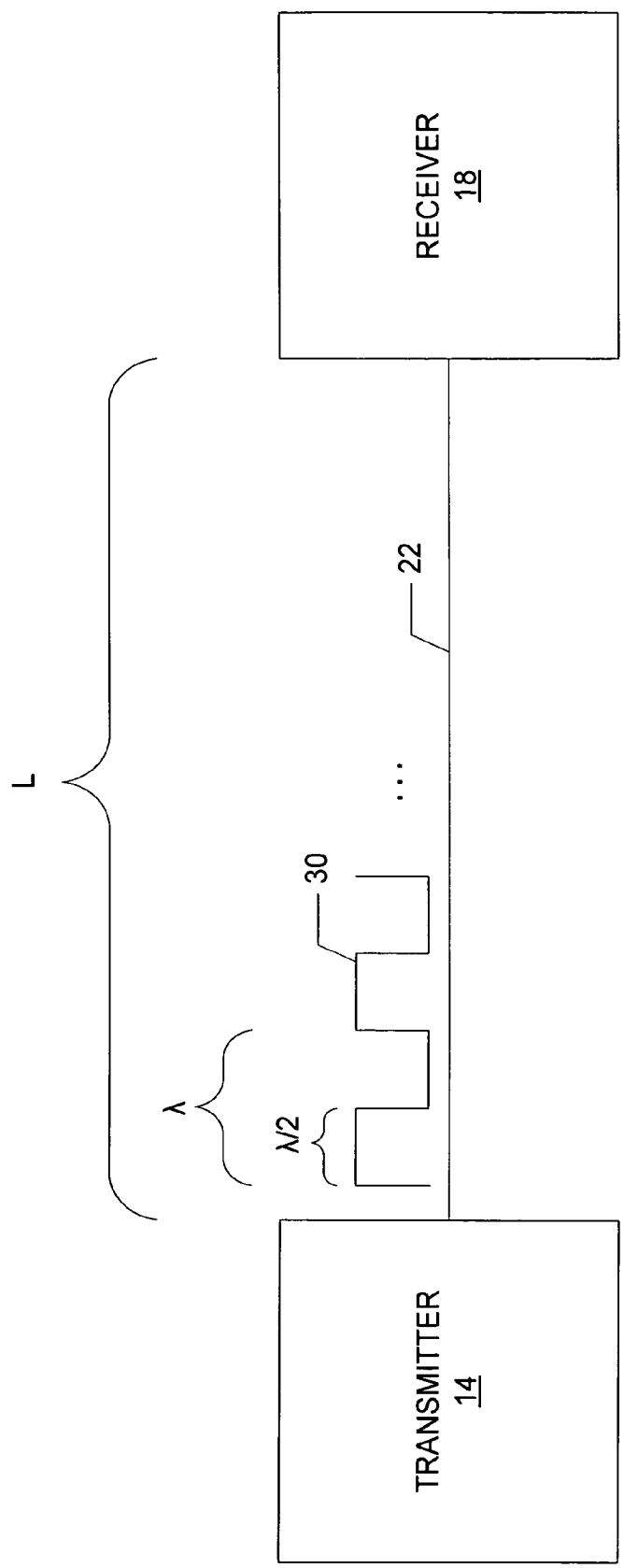
FIG. 2 is a diagram of the transmitter sending a digital signal to the receiver along the electrical trace, the electrical trace having a length specified in accordance with the principles of the invention.

FIG. 2 shows the electrical trace 22 having a length L extending between the transmitter 14 and the receiver 18. Consider, for the purposes of this FIG, that the transmitter 14 and the receiver 18 are the only two impedance discontinuities of interest on the electrical trace 22. The transmitter 14 transmits a periodic digital signal 30 to the receiver 18 at a frequency based upon the particular protocol used for communicating the digital signal 30. For example, if the digital signals are 8B/10B encoded signals, different protocols transfer the encoded signals at different data rates. For instance, current implementations of Fibre Channel operate at data rates of 1 Gbps, 2 Gbps, 4 Gbps, and 8 Gbps. As other examples, implementations of the SAS (Server Attached Storage) protocol operate at 3 Gbps and 6 Gbps; of the SATA (Serial Advanced Technology Attachment) protocol, at 1.5 Gbps, 3 Gbps, and 6 Gbps; and of the PCI Express protocol, at 2.5-Gbps and 5 Gbps. If the digital signals are 64B/66B encodings, for example, one implementation of Fibre Channel has a 10 Gbps rate and implementations of the LAN 10/100 protocol transmit at 1 Gbps and 10 Gbps rates. Encoded signals transmitted in accordance with any of these or other protocols can be used to practice the invention.

In general, the length, L, of the electrical trace 22 between two impedance discontinuities (here, the transmitter 14 and receiver 18) is designed for a particular frequency. Preferably, this frequency is the fundamental frequency of the digital signal 30; that is, the frequency that causes the most spectral content on the serial link between the transmitter 14 and receiver 18. For example, to illustrate the concept of fundamental frequency, consider a Fibre Channel implementation that sends a digital signal 30 over the serial link at a base data rate of 2 Gbps. This 2 Gbps data rate corresponds to a 1.0625 GHz frequency because two bits are transmitted during each cycle (i.e., data is clocked on both the rising and falling edges of the signal 30). Fibre Channel can also pass content between the transmitter 14 and receiver 18 at sub-frequencies of the fundamental frequency (e.g., at 531.25 MHz), but less spectral content is transmitted at this frequency than at 1.0625 GHz. Thus, the 1.0625 GHz signal rate is considered the fundamental frequency. That is, for the digital signal 30, there are more sine waves at the fundamental frequency than at any other frequency. This factor is attributable to the balanced encoding of the digital signal 30. By balanced, there are an equal number of high signals as low signals within a predetermined range of bits (e.g., 40 bits for 8b/10b encoding). In addition, a certain number of fundamental sine waves occur at predetermined times in the digital signal (e.g., for 8b/10b, every 200 bits) so that the receiver 18 can extract a clock from the signal i.e., "lock onto" the signal. As another example, for a Fibre Channel implementation having at a base data rate of 4 Gbps, the fundamental frequency is 2.125 GHz (here, two bits being clocked during each cycle).

To reduce or eliminate the undesirable effects of signal reflection caused by impedance discontinuities, the length L of the electrical trace 22 should not be equal to any integer multiple of the ratio of the propagation delay of the signal 30 traveling on the conductive medium to the one-half of the time equivalent of the fundamental frequency. That is, $$L \neq (T*N)/Pd, \qquad (\text{EQ. 1})$$

where L is the electrical trace length, Pd is the propagation delay, N is a positive, non-zero integer value, and T is the time for one-half of one cycle based on the fundamental frequency. For example, consider a transmitter 14 sending digital signals 30 over the electrical trace 22 that pass through a layer of FR4 material at a fundamental frequency of 1.0625 GHz. In this example, the time, T, is approximately equal to 470.6 ps and the propagation delay is approximately equal to 160.8 ps/in. Accordingly, values for the trace length L to be avoided when laying out the electrical trace 22 across one or more printed circuit boards are approximately equal to 2.93 inches (N=1), 5.85 inches (N=2), 8.78 inches (N=3), 11.71 inches (N=4), and so on. Such lengths are hereafter referred to as restricted lengths.

In accordance with the equation, EQ. 1, the restricted lengths determined for the electrical trace length L depend upon the propagation delay of the electrical signal, and the propagation delay is dependent on the medium through which the electrical signal travels. In general, the propagation delay is a function of capacitance divided by the square root of the dielectric constant of the material. For example, the propagation delay through FR4 material, with a dielectric constant of approximately 3.8, is approximately equal to 160 picoseconds per inch (ps/in). The dielectric constants of other materials, such as air, which has a dielectric constant of 1, result in different propagation delays. Consequently, the type of material of the printed circuit board 10 and the location of the electrical trace 22 on the printed circuit board 10 can affect the restricted lengths of the electrical trace.

To build tolerance into the design of the electrical trace length L, a guard band can be placed around the calculated restricted lengths. In one embodiment, the guard band is plus or minus ten percent of each calculated restricted length. Many board manufacturers adhere to a ten-percent tolerance in constructing the thickness of printed circuit boards, and thus a ten-percent guard band can compensate for the possible differences in printed circuit board thicknesses. Accordingly, if EQ. 1 produces a restricted length of 4 inches, for example, the ten-percent guard band produces a range of restricted lengths of 3.6 inches to 4.4 inches.

Figure 3:
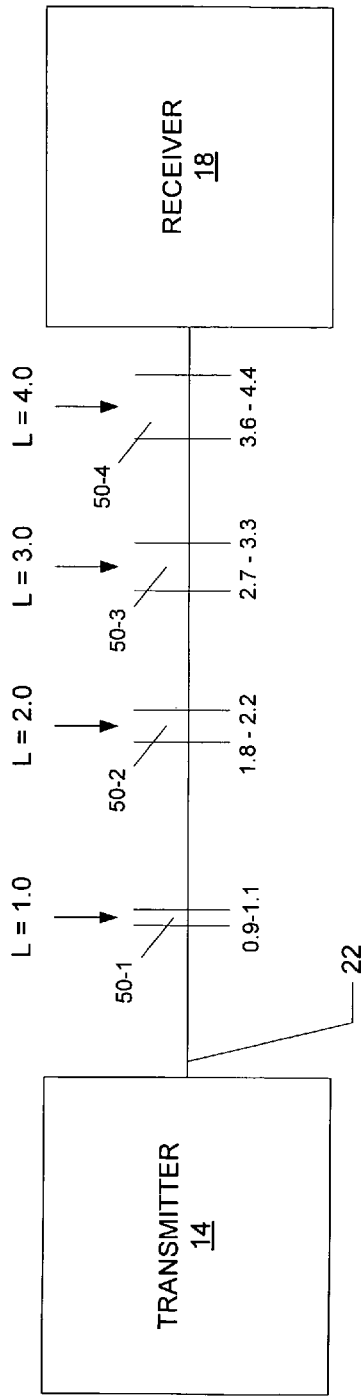
FIG. 3 is a diagram showing bands of restricted lengths for the electrical trace determined by applying a guard band to each restricted length.

Because integer multiples of a restricted length are also to be avoided, the guard bands for each multiple of the restricted length produce "bands" of restricted length ranges. FIG. 3 illustrates an exemplary series of such bands 50-1, 50-2, 50-3, 50-4 (generally, band 50). For illustration purposes only, consider for this series of bands 50 that the restricted length for N=1 is 1.0 inch, for N=2 is 2.0 inches, for N=3 is 3.0 inches, and so on, and that the guard band around each restricted length value is 10%. Accordingly, as the distance from the transmitter 14 increases, the individual bands 50 become wider. For instance, the band 50-1 of restricted lengths for L=1.0 inches ranges from 0.9 inches to 1.1 inches, a span of 0.2 inches, whereas the band 50-4 of restricted lengths for L=4.0 inches ranges from 3.6 inches to 4.4 inches, for a span of 0.8 inches.

Figure 4:
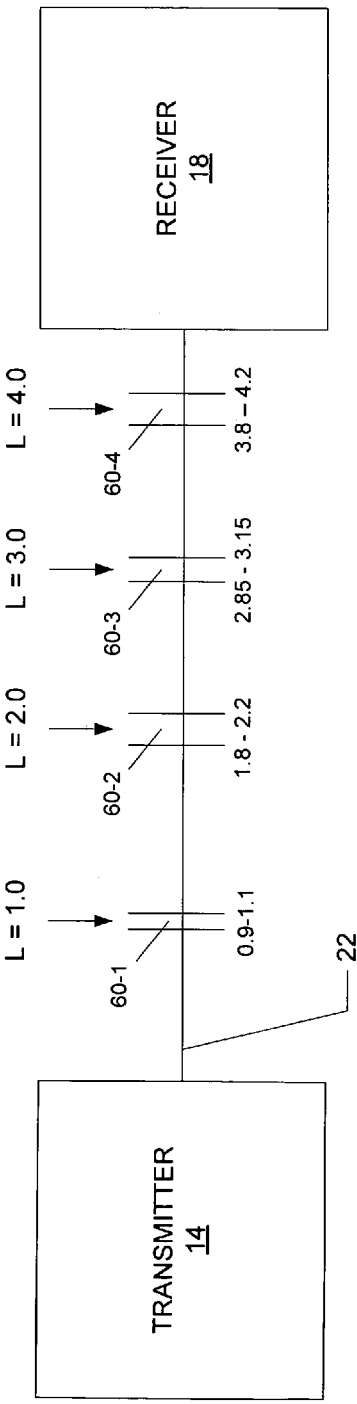
FIG. 4 is a diagram showing bands of restricted lengths for the electrical trace determined by applying different guard bands based on distance from the transmitter.

FIG. 4 shows an example of an alternative to maintaining the same percentage guard band for each restricted length. Similar to the example of FIG. 3, a series of bands 60-1, 60-2, 60-3, and 60-4 (generally, band 60) represents four ranges of restricted lengths corresponding to L=1 inch, 2 inches, 3 inches, and 4 inches, respectively. Here, like the example in FIG. 3, the guard band around the restricted lengths of 1 inch and 2 inches is 10%, but unlike the example in FIG. 3, the guard band around the restricted lengths of 3 and 4 inches is 5%. Smaller guard bands may be used at greater distances from the transmitter 14 because distance diminishes the effects of signal reflections upon the transmission of signals. In general, as a reflected signal travels an electrical trace, it degrades, losing amplitude, and, thus, a transmitter that is distant from the point of reflection sees a smaller reflected signal than a transmitter situated closer. The use of smaller guard bands at farther distances from the transmitter 14 can also have an effect of making the bands 60 more uniform in width than using the same guard band percentage for each restricted length.

Figure 5:
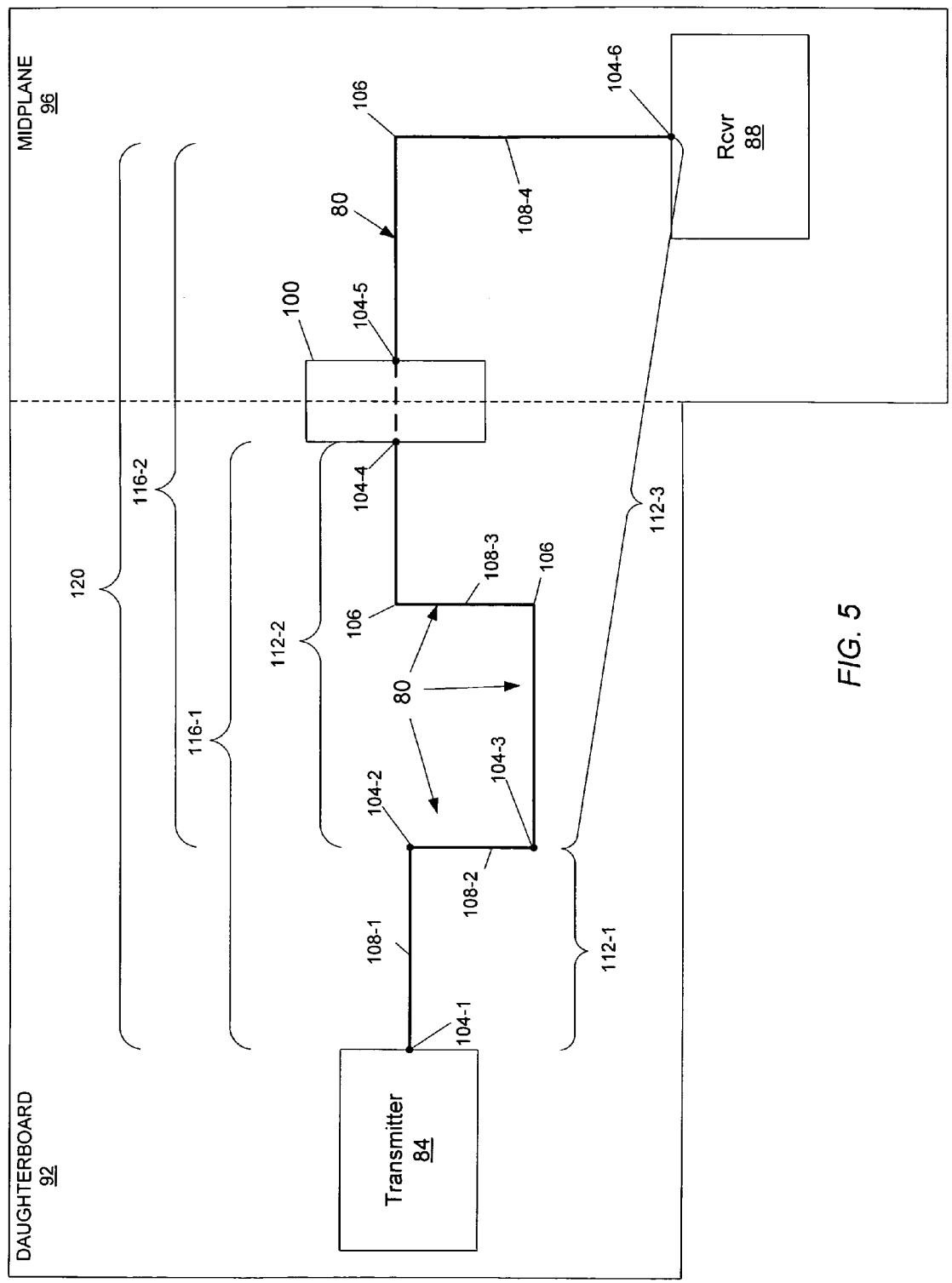
FIG. 5 is a diagram of an embodiment of a transmitter in communication with a receiver by way of an electrical trace that is partitioned into trace segments and grouped into trace segment groups, each trace segment and, optionally, each trace segment group having a length specified in accordance with the principles of the invention.

FIG. 5 shows another example of an electrical trace 80 embodying a point-to-point serial link between two endpoints, here, a transmitter 84 and a receiver 88. Here, the transmitter 84 is disposed on a daughterboard 92 and the receiver 88 is disposed on a midplane 96. Mated electrical connectors 100 connect the daughterboard 92 to the midplane 96. The path of the electrical trace 80 extends through the electrical connectors 100. In a storage system, for example, the transmitter 84 can be disk drive and the receiver 88 can be a port bypass circuit (PBC) component, both of which are connected to the midplane 96 by one of the mated electrical connectors 100.

A plurality of impedance discontinuities, represented in FIG. 5 as locations or points 104-1, 104-2, 104-3, 104-4, 104-5 and 104-6 (generally, impedance discontinuity 104), are present in the serial link. Each impedance discontinuity represents a location along the electrical trace 80 where signal reflection can potentially occur. Impedance discontinuities are attributable to various factors, such as an interface between a copper etch of the electrical trace to one of the electrical components (104-1 and 104-6), an interface of a copper etch to a connector pin (104-4, 104-5), and a layer change in the printed circuit board through a via (104-2 and 104-3). Corners 106 formed in the electrical trace 80 can also be considered impedance discontinuities, although in the embodiment shown, corners are not deemed as such.

In the example shown, the electrical trace 80 has four trace segments 108-1, 108-2, 108-3, and 108-4 (generally, 108). In general, each pair of adjacent impedance discontinuities 104 defines one of the trace segments 108. Here, impedance discontinuities 104-1 and 104-2 define trace segment 108-1; impedance discontinuities 104-2 and 104-3 define trace segment 108-2; impedance discontinuities 104-3 and 104-4 define trace segment 108-3; and impedance discontinuities 104-5 and 104-6 define trace segment 108-4. In accordance with the principles of the invention, each trace segment 108 is designed with a length that falls outside of each band of restricted lengths, calculated as described above. The calculation of these bands can apply the same or different guard bands to the trace segments (e.g., applying smaller guard bands to trace segments that are more distant from the transmitter than closer trace segments).

In one embodiment, the combined lengths of contiguous trace segments 108 are also considered when determining the lengths of the various trace segments 80. (For purposes of this determination, trace segments 108-3 and 108-4 are considered contiguous, although these trace segments are not abutting, except that both terminate at opposite sides of the connectors 100). Trace segment groups can include two or more contiguous trace segments 108. Here, contiguous trace segments 108-1 and 108-2 together form trace segment group 112-1, contiguous trace segments 108-2 and 108-3 form trace segment group 112-2, and contiguous trace segments 108-3 and 108-4 form trace segment group 112-3. Groupings of three contiguous trace segments include 1) trace segment group 116-1, comprised of trace segments 108-1, 108-2, and 108-3, and 2) trace segment group 116-2, comprised of trace segments 108-2, 108-3, and 108-4. The entire electrical trace 80 can also be considered a trace segment group 120, comprised of trace segments 108-1, 108-2, 108-3, and 108-4.

When determining the lengths of the various trace segments 108, the length of any one or combination of these trace segment groups 112, 116, and 120 can also be designed to be unequal to any restricted length in one of the bands of restricted lengths. For example, for some embodiments certain types of trace segment groups, e.g., those that span more than three contiguous trace segments, can be omitted from consideration in the design of the electrical trace 80. In addition, similar to the calculations of the restricted lengths for trace segments 108, restricted length calculations for the trace segment groups 112, 116, and 120 can apply different guard bands.

Figure 6:
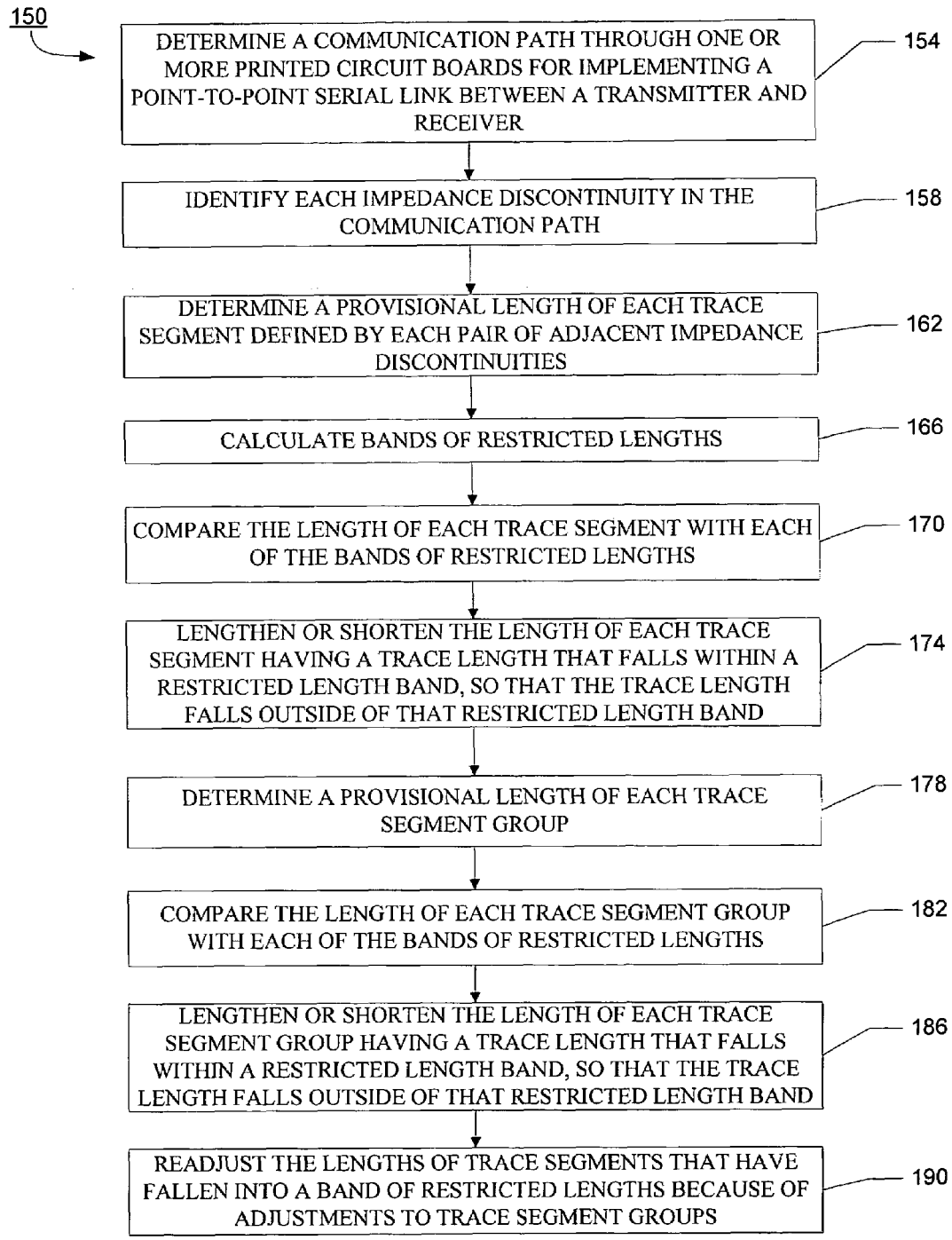
FIG. 6 is a flow diagram of an embodiment of a process for designing an electrical trace length for a point-to-point serial link between a transmitter and a receiver.

FIG. 6 shows an embodiment of a process 150 for designing a point-to-point serial link between a transmitter and a receiver. Other embodiments of the process 150 can perform the following and other steps in a different order from that described. At step 154, a communication path traversing one or more printed circuit boards is determined for implementing the point-to-point serial link. At step 158, each impedance discontinuity in the communication path is identified. A provisional length of each trace segment, defined by each pair of adjacent impedance discontinuities, is determined (step 162). Each length is provisional in that it may need adjusting in accordance with the principles of the invention.

At step 166, bands of restricted lengths are calculated using one or more guard band values. Different guard band values may be used for different trace segments. The length of each trace segment is compared (step 170) with each of the bands of restricted lengths. One technique for performing the comparison is to determine whether the equation $$N = (Pd \cdot L)/T,  \quad (\text{EQ. 2})$$

where L is the provisional length of the trace segment, Pd is the propagation delay, and T is the time for one-half of one cycle based on the fundamental frequency, produces an integer value for N (within a specified guard band). For each trace segment having a provisional trace length that falls within a band of restricted lengths, lengthen or shorten (step 174) that trace segment so that its length falls outside of that band.

Optionally, also determine (step 178) a length of each trace segment group, compare (step 182) these lengths with the calculated bands of restricted lengths, and lengthen or shorten (step 186) the length of that trace segment group so that its length does not equal a restricted length in any one of the calculated bands. Adjusting the lengths of one or more trace segment groups entails altering the current length of one or more trace segments that make up the trace segment group. Any alterations of a trace segment length should not cause that length to become equal to a restricted length. If so, the length of the trace segment is readjusted (step 190), as described in steps 170 and 174.

Given certain design considerations, e.g., the available space for routing the communication path through and across printed circuit boards, the number of trace segments, and the number of trace segment groups, it may occasionally be difficult to satisfy the restricted length requirements for each trace segment and each trace segment group for a given serial link. Accordingly, priority can be given towards satisfying first the restricted length requirements of the trace segments, starting with those trace segments that are closer to the transmitter. Then attention may be given to satisfying restricted length requirements of the trace segment groups. Prioritization of the trace segment groups can occur according to the number of trace segments in the trace segment groups, (e.g., work with trace segment groups having two contiguous trace segments before those with three, and so on), or according to their overall length (e.g., work with trace segment groups that are one inch in length before those of two inches—although the shorter trace segment group may include more trace segments than a longer trace segment group). Another technique for increasing design flexibility is to use smaller guard bands for lower-priority trace segments and trace segment groups. Smaller guard bands restrict fewer potential trace lengths than larger guard bands; that is, the bands of restricted lengths are smaller, thus leaving more trace lengths available for trace segments and trace segment groups.

Processes for practicing the present invention may be implemented as one or more computer-readable software programs designed for execution on a computer system and embodied on or in one or more articles of manufacture. The article of manufacture can be, for example, any one or combination of a floppy disk, a hard disk, hard-disk drive, a CD-ROM, a DVD-ROM, a flash memory card, an EEPROM, an EPROM, a PROM, a RAM, a ROM, or a magnetic tape. In general, any standard or proprietary, programming or interpretive language can be used to produce the computer-readable software programs. Examples of such languages include C, C++, Pascal, JAVA, BASIC, Visual Basic, and Visual C++. The software programs may be stored on or in one or more articles of manufacture as source code, object code, interpretive code, or executable code.

While the invention has been shown and described with reference to specific preferred embodiments, it should be understood by those skilled in the art that various changes in form and detail may be made therein without departing from the spirit and scope of the invention as defined by the following claims.

What is claimed is:

1. A method of designing a length of an electrical trace used to implement a point-to-point serial link for conveying a digital signal between a transmitter and a receiver, the method comprising:
   identifying a trace segment of the electrical trace, the trace segment having a first endpoint determined by a first impedance discontinuity on the point-to-point serial link and a second endpoint determined by a second impedance discontinuity on the point-to-point serial link;
   calculating a restricted length for the trace segment based on a propagation delay of the signal along the point-to-point serial link and on a frequency of the signal;
   setting a length of the trace segment to be unequal to the restricted length; and
   defining a guard band around the restricted length to define a range of restricted lengths, and restricting the length of the trace segment from any restricted length in the range.

2. The method of claim 1, wherein the guard band is approximately ten percent of the restricted length.

3. The method of claim 1, wherein the step of determining a restricted length for the trace segment includes determining a plurality of discontinuous bands of restricted lengths.

4. The method of claim 1, further comprising identifying a group of contiguous trace segments, and setting a length of the trace segment group to be unequal to the restricted length.

5. The method of claim 1, further comprising identifying a second trace segment; determining a restricted length for the second trace segment; and setting a length of the second trace segment to be unequal to the restricted length determined for the second trace length.

6. The method of claim 5, further comprising defining a range of restricted lengths for each determined restricted length by defining a guard band for each restricted length.

7. The method of claim 6, wherein the guard band around one restricted length is different from the guard band around the other restricted length.

8. The method of claim 1, wherein the signal is an 8B/10B encoded signal.

9. The method of claim 1, wherein the signal is a 64B/66B encoded signal.

10. The method of claim 1, wherein the transmitter and receiver communicate over the point-to-point serial link in accordance with a Fibre Channel protocol.

11. The method of claim 1, wherein the frequency of the digital signal has a fundamental frequency.

12. A system, comprising:
   a transmitter transmitting a digital signal at a frequency;
   a receiver in communication with the transmitter by way of a point-to-point serial link for receiving the digital signal; and
   a trace segment in the point-to-point serial link, the trace segment having a first endpoint determined by a first impedance discontinuity on the point-to-point serial link and a second endpoint determined by a second impedance discontinuity on the point-to-point serial link, the trace segment having a trace length that is unequal to a restricted length determined for the point-to-point serial link based on a propagation delay of the digital signal and the frequency and wherein the restricted length has a guard band that defines a range of restricted lengths and the length of the trace segment is different from any restricted length in the range.

13. The system of claim 12, further comprising a second trace segment having endpoints determined by impedance discontinuities on the point-to-point serial link, the second trace segment having a trace length that is unequal to the restricted length.

14. The system of claim 13, wherein the trace segments are contiguous and define a trace segment group, and a length of the trace segment group is different from the restricted length determined for the point-to-point serial link.

15. The system of claim 12, wherein the signal is an 8B/10B encoded signal.

16. The system of claim 12, wherein the signal is an 64B/66B encoded signal.

17. The system of claim 12, wherein the transmitter and receiver communicate over the point-to-point serial link in accordance with a Fibre Channel protocol.

18. The system of claim 12, wherein the transmitter and receiver are disposed on different printed circuit boards.

19. The system of claim 12, wherein the frequency of the digital signal has a fundamental frequency.

20. A system of designing a length of an electrical trace used to implement a point-to-point serial link for conveying a digital signal between a transmitter and a receiver, the system comprising:

means for identifying a trace segment of the electrical trace, the trace segment having a first endpoint determined by a first impedance discontinuity on the point-to-point serial link and a second endpoint determined by a second impedance discontinuity on the point-to-point serial link;

means for calculating a restricted length for the trace segment based on a propagation delay of the signal along the point-to-point serial link and on a frequency of the signal;

means for setting a length of the trace segment to be unequal to the restricted length; and means for defining a guard band around the restricted length to define a range of restricted lengths, and restricting the length of the trace segment from any restricted length in the range.

* * * * *